US012660247B2

(12) United States Patent
Lin

(10) Patent No.: US 12,660,247 B2
(45) Date of Patent: Jun. 16, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventor: Ta-Chun Lin, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 420 days.

(21) Appl. No.: 18/336,377

(22) Filed: Jun. 16, 2023

(65) Prior Publication Data

US 2024/0421205 A1 Dec. 19, 2024

(51) Int. Cl.
| | |
|---|---|
| *H01L 29/423* | (2006.01) |
| *H01L 21/306* | (2006.01) |
| *H01L 29/06* | (2006.01) |
| *H01L 29/417* | (2006.01) |
| *H01L 29/66* | (2006.01) |

(Continued)

(52) U.S. Cl.
CPC ....... *H10D 30/6735* (2025.01); *H10D 30/014* (2025.01); *H10D 30/43* (2025.01); *H10D 30/6729* (2025.01); *H10D 30/6757* (2025.01); *H10D 62/121* (2025.01); *H10D 64/017* (2025.01); *H10P 50/644* (2026.01)

(58) Field of Classification Search
CPC .. H10D 30/6735; H10D 30/014; H10D 30/43; H10D 30/6729; H10D 30/6757; H10D 62/121; H10D 64/017; H10D 30/0193; H10D 30/0194; H10D 30/506; H10D 30/508; H10D 62/116; H01L 21/30608; H01L 21/3065; B82Y 10/00

USPC .......................................................... 257/288
See application file for complete search history.

(56) References Cited

U.S. PATENT DOCUMENTS

| | | | |
|---|---|---|---|
| 2017/0256609 A1* | 9/2017 | Bhuwalka | H10D 30/43 |
| 2019/0067490 A1* | 2/2019 | Yang | H10D 30/6735 |

(Continued)

FOREIGN PATENT DOCUMENTS

| | | |
|---|---|---|
| TW | 202119479 A | 5/2021 |
| TW | 202127630 A | 7/2021 |
| TW | 202307926 A | 2/2023 |

OTHER PUBLICATIONS

Office Action issued in connection with Taiwan Appl. No. 112129859 dated May 27, 2024.

*Primary Examiner* — Tong-Ho Kim
(74) *Attorney, Agent, or Firm* — Foley & Lardner LLP

(57) ABSTRACT

A method for fabricating a semiconductor device is disclosed. The method includes forming, over a substrate, a stack extending along a first lateral direction, wherein the stack includes a plurality of first semiconductor layers and a plurality of second semiconductor layers alternately arranged on top of one another; overlaying a first portion of the stack with a first gate structure, wherein the first gate structure extends along a second lateral direction perpendicular to the first lateral direction; removing a second portion of the stack through a first etching process, wherein the second portion was disposed next to the first portion along the first lateral direction; and removing a third portion of the stack through a second etching process, wherein the third portion was disposed next to a lower part of the second portion.

20 Claims, 19 Drawing Sheets

300

(51) Int. Cl.

| | |
|---|---|
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10P 50/64* | (2026.01) |

(56) References Cited

U.S. PATENT DOCUMENTS

| | | | |
|---|---|---|---|
| 2020/0220018 A1* | 7/2020 | Jang | B82Y 10/00 |
| 2021/0359142 A1* | 11/2021 | Huang | H10D 84/0167 |
| 2022/0376072 A1 | 11/2022 | Huang et al. | |

* cited by examiner

200

| | |
|---|---|
| Provide substrate | ~202 |
| Form stack structure including 1$^{st}$ semiconductor layers & 2$^{nd}$ semiconductor layers | ~204 |
| Form isolation structure | ~206 |
| Form dummy gate structure | ~208 |
| Remove 1$^{st}$ portions of the stack structure | ~210 |
| Remove 2$^{nd}$ portions of the stack structure | ~212 |
| Form inner spacers | ~214 |
| Form source/drain structures | ~216 |
| Form active gate structure | ~218 |

300

302

300

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
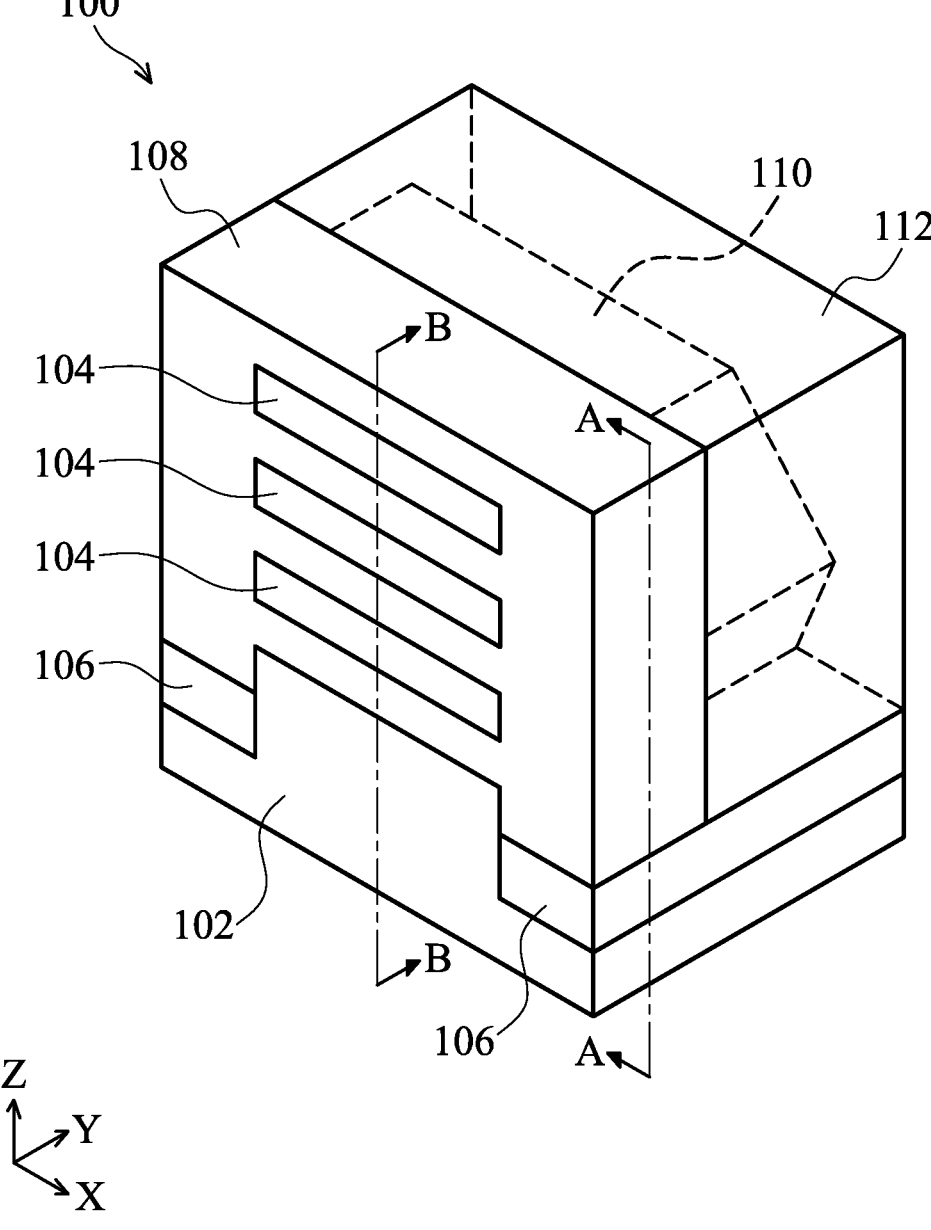
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a FinFET, a gate electrode is adjacent to three side surfaces of a channel region/structure with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region can be surrounded by the gate electrode, which allows for fuller depletion in the channel region and results in less short-channel effects due to steeper sub-threshold current swing (SS) and smaller drain induced barrier lowering (DIBL).

As transistor dimensions are continually scaled down to sub 10-15 nm technology nodes, further improvements of the GAA FET are required. For example, the GAA FET typically has its channel structure formed of a number of nanostructures (e.g., nanosheets). These nanostructures are vertically spaced from one another in a vertical direction, allowing a gate structure of the GAA FET to wrap around each of the nanostructures. In the existing technologies, source/drain structures of the GAA FET are typically formed by regrowing epitaxial structures from exposed sidewalls of the nanostructures. In general, the sidewalls are exposed through a single anisotropic etching process performed on a stack structure including the nanostructures. Such an anisotropic etching process may inherently etch the upper nanostructure(s) more than the lower nanostructure(s). In other words, the lower nanostructure may have a longer longitudinal length than the upper nanostructure. This "extended" length of one or more of the nanostructures can disadvantageously impact performance of the corresponding GAA FET, e.g., higher channel resistance, higher channel capacitance, etc. Thus, the existing technologies to form GAA FETs have not been entirely satisfactory in many aspects.

Embodiments of the present disclosure are discussed in the context of forming a nanostructure field-effect-transistor (FET) device (sometimes referred to as a gate-all-around (GAA) FET device), and in particular, in the context of forming the channel structure of a GAA FET device. In some aspects of the present disclosure, a stack, including a number of semiconductor channel layers spaced from one another by a corresponding semiconductor sacrificial layer, is patterned at least by a series of etching processes. For example, a first etching process with an anisotropic characteristic may be initially performed on the stack to remove a first portion of the stack, exposing sidewalls of each of the semiconductor channel layers. Next, a second etching process with an isotropic characteristic may be performed to inwardly push the sidewalls of each of the semiconductor channel layers. Consequently, the longer, lower semiconductor channel layer(s), e.g., after the first etching process, can be trimmed shorter through the second etching process. As such, the above-identified technical issues can be resolved. Alternatively or additionally, the lower semiconductor channel layer can be trimmed even shorter than upper semiconductor channel layer(s) for certain applications.

FIG. 1 illustrates a perspective view of an example nanostructure transistor device (e.g., a GAA FET device) 100, in accordance with various embodiments. The GAA FET device 100 includes a substrate 102 and a number of nanostructures (e.g., nanosheets, nanowires, etc.) 104 above the substrate 102. The semiconductor layers 104 are vertically separated from one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. An interlayer dielectric (ILD) 112 is disposed over the source/drain structure 110.

It should be appreciated that FIG. 1 depicts a simplified GAA FET device, and thus, one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108 (e.g., in the X direction); and cross-section B-B is cut along a longitudinal axis of one of the semiconductor layers 104 and in a direction of a current flow between the source/drain structures (e.g., in the Y direction). Subsequent figures may refer to these reference cross-sections for clarity.

Figure 2:
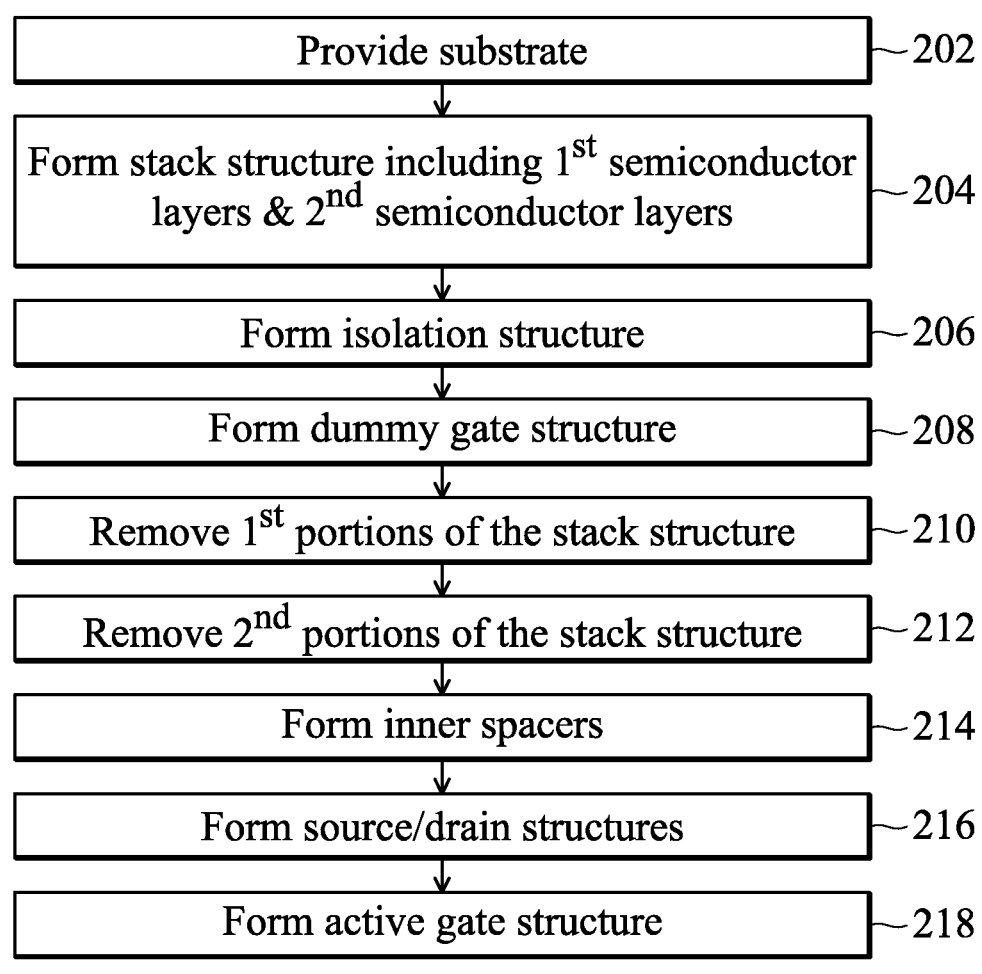
FIG. 2 illustrates a flow chart of an example method for making a non-planar transistor device, in accordance with some embodiments.

FIG. 2 illustrates a flowchart of a method 200 to form a nanostructure transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, at least a portion of a complementary field-effect-transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4, 5, 6, 7, 8, 9, 10, 11, 12, 13, 14, and 15, respectively, which will be discussed in further detail below.

In brief overview, the method 200 starts with operation 202 of providing a substrate. The method 200 continues to operation 204 of forming a stack structure including a number of first semiconductor layers and a number of second semiconductor layers. The method 200 continues to operation 206 of forming an isolation structure. The method 200 continues to operation 208 of forming a dummy gate structure. The method 200 continues to operation 210 of removing first portions of the stack structure that are not overlaid by the dummy gate structure through a first etching process. The method 200 continues to operation 212 of removing second portions of the stack structure through a second etching process. The second portion was located next to a lower part of the first portion along a longitudinal direction of the stack structure. In some embodiments, the first etching process and the second etching process may have respective conditions to reach different etching directions. The method 200 continues to operation 214 of forming inner spacers. The method 200 continues to operation 216 of forming source/drain structures. The method 200 continues to operation 218 of forming an active gate structure wrapping around each of the second semiconductor layers.

As mentioned above, FIGS. 3-15 each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Figure 3:
FIGS. 3, 4, 5, 6, 7, 8, 9, 10, 11, 12, 13, 14, and 15 illustrate cross-sectional views of an example GAA FET device (or a portion of the example GAA FET device) during various fabrication stages, made by the method of FIG. 2, in accordance with some embodiments.
Figure 3:
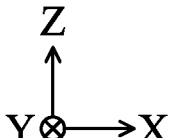

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction perpendicular to the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
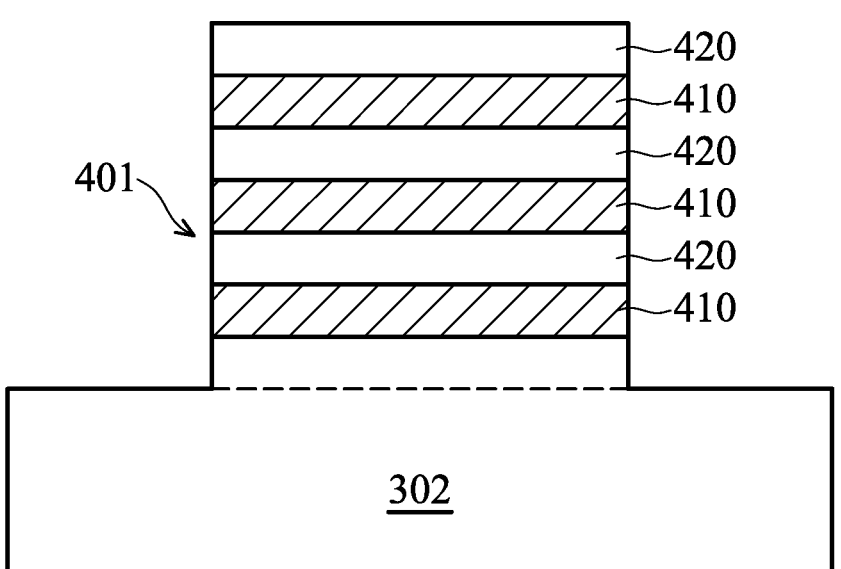

Corresponding to operation 204 of FIG. 2, FIG. 4 is a cross-sectional view of the GAA FET device 300 in which a number of first semiconductor layers 410 and a number of second semiconductor layers 420 are formed on the substrate 302 at one of the various stages of fabrication. The cross-sectional view of FIG. 4 is cut in a direction perpendicular to the lengthwise direction of an active/dummy gate structure of the GAA FET device 300 (e.g., cross-section A-A indicated in FIG. 1).

As shown, the first semiconductor layers 410 and the second semiconductor layers 420 are alternatingly disposed on top of one another (e.g., along the Z direction) to form a stack. For example, one of the second semiconductor layers 420 is disposed over one of the first semiconductor layers 410 then another one of the first semiconductor layers 420 is disposed over the second semiconductor layer 410, so on and so forth. The stack may include any number of alternately disposed first and second semiconductor layers 410 and 420, respectively. For example in FIG. 4, the first stack includes 3 first semiconductor layers 410, with 3 second semiconductor layers 420 alternatingly disposed therebetween and with one of the second semiconductor layers 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 420 (e.g., of silicon). In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302, the semiconductor layers 410 and 420 may be patterned to form one or more stack structures (e.g., 401). Each of the stack structures is elongated along a lateral direction (e.g., the Y direction), and includes a stack of the patterned semiconductor layers 410-420 alternatively arranged on top of one another. The stack structure 401 is formed by patterning the semiconductor layers 410-420 and the semiconductor substrate 302 using, for example, photolithography and etching techniques. For example, a mask layer (which can include multiple layers such as, for example, a pad oxide layer and an overlying pad nitride layer) is formed over the topmost semiconductor layer (e.g., 420 in FIG. 4). The pad oxide layer may be a thin film comprising silicon oxide formed, for example, using a thermal oxidation process. The pad oxide layer may act as an adhesion layer between the topmost semiconductor layer 410 (or the semiconductor layer 420 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form trenches (or openings), thereby defining the stack structures 401 between adjacent trenches. When multiple stack structures are formed, such a trench may be disposed between any adjacent ones of the stack structures. In some embodiments, the stack structure 401 is formed by etching trenches in the semiconductor layers 410-420 and substrate 302 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the stack structure 401.

Figure 5:
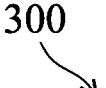
Figure 5:
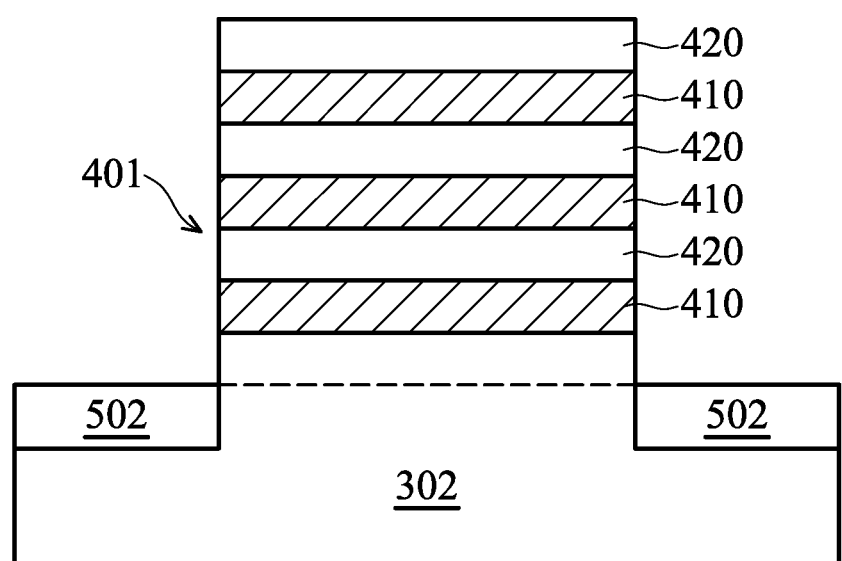
Figure 5:
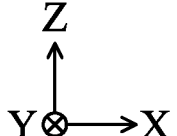

Corresponding to operation 206 of FIG. 2, FIG. 5 is a cross-sectional view of the GAA FET device 300 including one or more isolation structures 502, at one of the various stages of fabrication. The cross-sectional view of FIG. 5 is cut in a direction perpendicular to the lengthwise direction of an active/dummy gate structure of the GAA FET device 300 (e.g., cross-section A-A indicated in FIG. 1).

The isolation structure 502, which can include multiple portions, may be formed between adjacent stack structures, or next to a single stack structure. The isolation structure 502, which is formed of an insulation material, can electrically isolate neighboring stack structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the stack structure 401.

The patterned mask may also be removed by the planarization process, in various embodiments.

Next, the insulation material is recessed to form the isolation structure 502, as shown in FIG. 5, which is sometimes referred to as a shallow trench isolation (STI). The isolation structure 502 is recessed such that the stack structure 401 protrudes from between neighboring portions of the isolation structure 502. The top surface of the isolation structures (STIs) 502 may have a flat surface (as illustrated), a convex surface, a concave surface (such as dishing), or combinations thereof. The top surface of the isolation structure 502 may be formed flat, convex, and/or concave by an appropriate etch. The isolation structure 502 may be recessed using an acceptable etching process, such as one that is selective to the material of the isolation structure 502. For example, a dry etch or a wet etch using dilute hydrofluoric (DHF) acid may be performed to recess the isolation structure 502.

Figure 6:
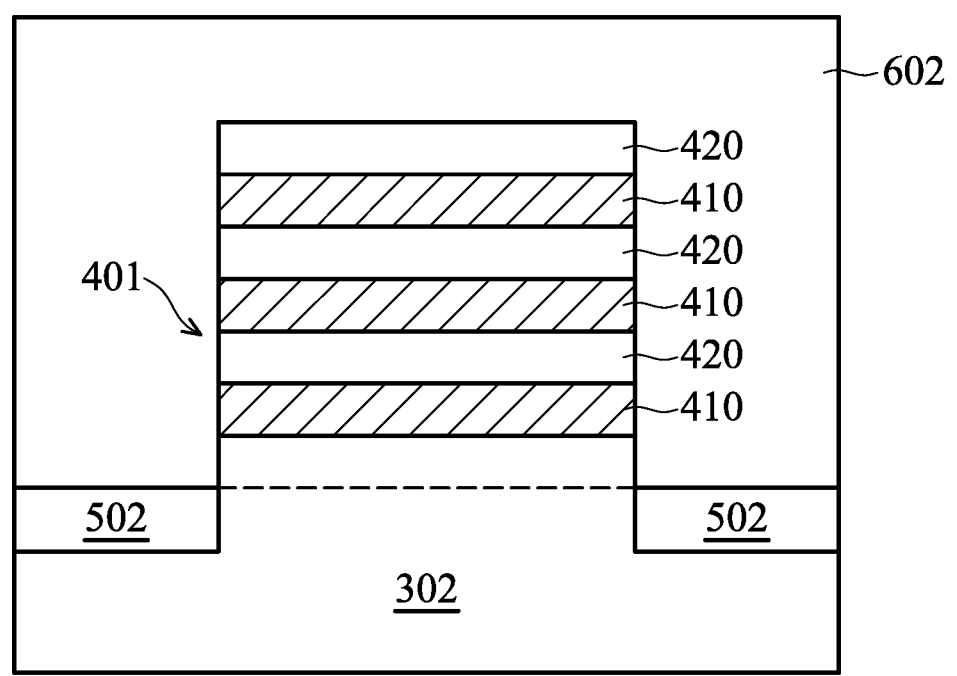

Corresponding to operation 208 of FIG. 2, FIG. 6 is a cross-sectional view of the GAA FET device 300 including a dummy gate structure 602, at one of the various stages of fabrication. The cross-sectional view of FIG. 6 is cut in a direction perpendicular to the lengthwise direction of an active/dummy gate structure of the GAA FET device 300 (e.g., cross-section A-A indicated in FIG. 1).

Next, the dummy gate structure 602 is formed over the stack structure 401 and the isolation structure 502. In general, the dummy gate structure 602 extends along a lateral direction (e.g., the X direction) perpendicular to the lengthwise direction of the stack structure 401. The dummy gate structure 602 may be formed in a place where an active (e.g., metal) gate structure is later formed, i.e., defining a footprint of the active gate structure, in various embodiments. The dummy gate structure 602 is placed over a portion of stack structure 401. Such an overlaid portion of the stack structure 401, which includes portions of the second semiconductor layers 420 that are collectively configured as a conduction channel and portions of the first semiconductor layers 410 that are replaced with an active gate structure. As such, the active gate structure can wrap around each of the portions of the second semiconductor layers 420, which will be discussed in further detail below.

In some embodiments, the dummy gate structure 602 can include one or more Si-based or SiGe-based materials that are similar (or having similar etching rates) as the first semiconductor layers 410 such as, for example, SiGe. The dummy gate structure 602 may be deposited by CVD, PECVD, ALD, FCVD, or combinations thereof. Although the dummy gate structure 602 is shown as being formed as a single-piece in the illustrated embodiment of FIG. 6, it should be understood that the dummy gate structure 602 can be formed to have multiple portions, each of which may include respective different materials.

Figure 7:
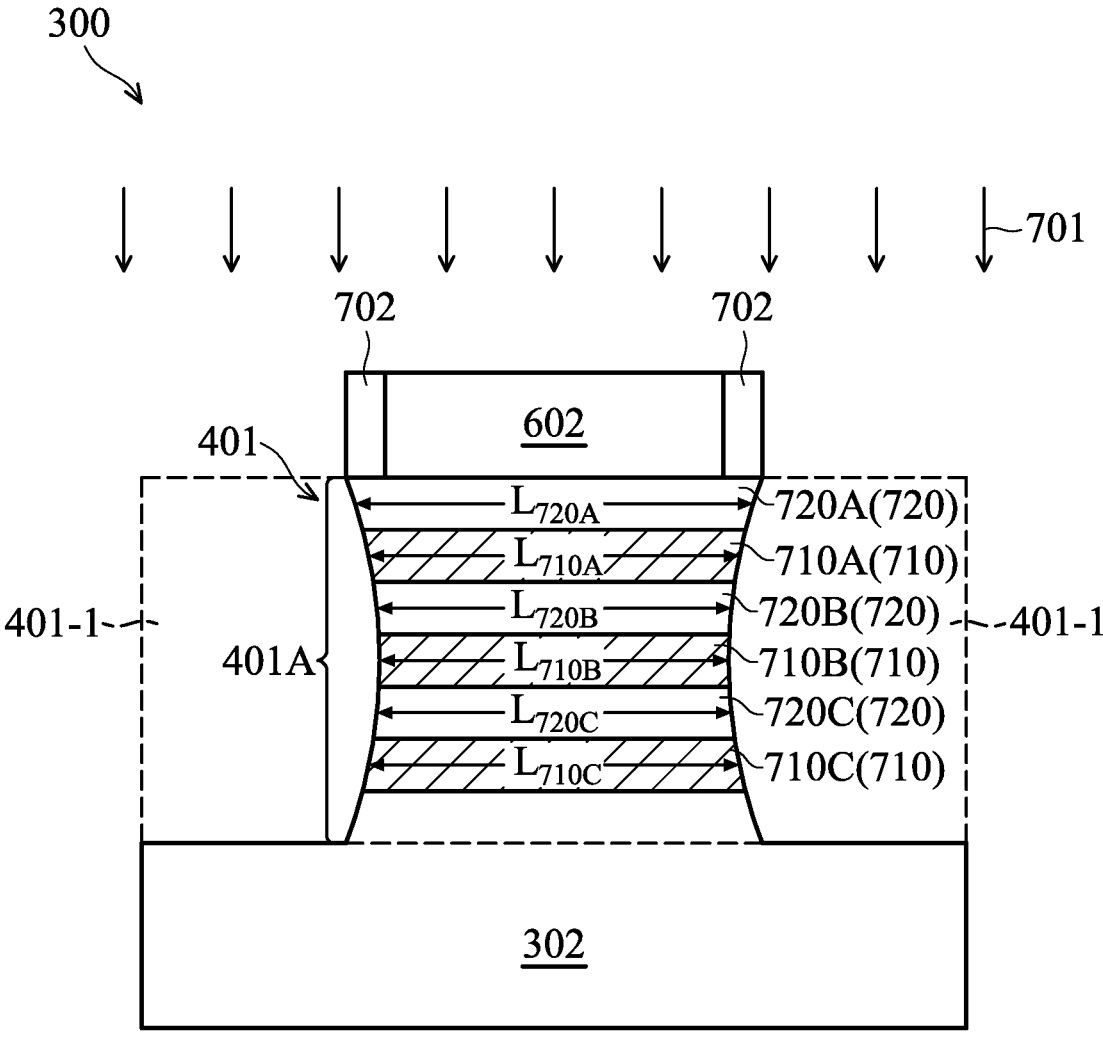
Figure 7:
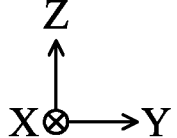

Corresponding to operation 210 of FIG. 2, FIG. 7 is a cross-sectional view of the GAA FET device 300 in which first portions of the stack structure 401 that are not overlaid by the dummy gate structure 602 are removed through a first etching process 701, at one of the various stages of fabrication. Such first portions are indicated by dotted lines and referenced as 401-1 in FIG. 7. The cross-sectional view of FIG. 7 is cut in the lengthwise direction of a fin structure of the GAA FET device 300 (e.g., cross-section B-B indicated in FIG. 1).

After forming the dummy gate structure 602, a pair of gate spacers 702 can be formed along opposite sidewalls of the dummy gate structure 602, as shown in FIG. 7. As such, each of the gate spacers 702 may also straddle the stack structure 401. The gate spacers 702 may include a low-k dielectric material and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 702.

Next, during the first etching process 701, the dummy gate structure 602, together with the gate spacers 702, can serve as a mask to etch the non-overlaid portions of the stack structure 401. The first etching process 701 may have an anisotropic characteristic to directionally (e.g., vertically) etch the stack structure 401. Accordingly, the stack structure 401 has respective remaining portions of the semiconductor layers 410 and 420 alternately stacked on top of one another. For example in FIG. 7, semiconductor layers 710 and 720 (of the stack structure 401) are the remaining portions of the semiconductor layers 410 and 420 overlaid by the dummy gate structure 602 (and the gate spacer 702), respectively. In some embodiments, the semiconductor layers 710 and 720 may sometimes be referred to as nanostructures (e.g., nanosheets) 710 and 720, respectively.

In some embodiments, upon performing the first etching process 701, the stack structure 401 may have its sidewalls 401A each presented in a bow-shape, as illustrated in FIG. 7. The term "bow-shape," as used herein, may refer to a curve having its middle portion protruding farther than its side portions. With such bow-shaped sidewalls, the stack structure 401 may have at least one of its upper portion or lower portion extending farther in the Y direction than its middle portion. Alternatively stated, the topmost semiconductor layer 720A, middle semiconductor layer 720B, and bottommost semiconductor layer 720C may have their own longitudinal lengths, characterized as $L_{720A}$, $L_{720B}$, and $L_{720C}$, respectively; and the topmost semiconductor layer 710A, middle semiconductor layer 710B, and bottommost semiconductor layer 710C may also have their own longitudinal lengths, characterized as $L_{710A}$, $L_{710B}$, and $L_{710C}$, respectively.

For example, in the embodiments of FIG. 7, the bottommost semiconductor layer 720C and the topmost semiconductor layer 720A may each have a longer longitudinal length than the middle semiconductor layer 720B. That is, $L_{720A}$ is approximately equal to (or slightly less than) $L_{720C}$ while each of $L_{720A}$ and $L_{720C}$ is greater than $L_{720B}$ ($L_{720A} \approx L_{720C} > L_{720B}$). Similarly, the bottommost semiconductor layer 710C and the topmost semiconductor layer 710A may each have a longer longitudinal length than the middle semiconductor layer 710B. That is, $L_{710A}$ is approximately equal to (or slightly less) than $L_{710C}$ while each of $L_{710A}$ and $L_{710C}$ is greater than $L_{710B}$ ($L_{710A} \approx L_{710C} > L_{710B}$).

In some other embodiments, the bottommost semiconductor layer 720C is longer than any of the topmost semiconductor layer 720A or the middle semiconductor layer 720B (in which the topmost semiconductor layer 720A and the middle semiconductor layer 720B may approximately have the same length); and bottommost semiconductor layer 710C is longer than any of the topmost semiconductor layer 710A or the middle semiconductor layer 710B (in which the topmost semiconductor layer 710A and the middle semiconductor layer 710B may approximately have the same length). That is, $L_{720A}$ is approximately equal to $L_{720B}$ while each of $L_{720A}$ and $L_{720B}$ is less than $L_{720C}$ ($L_{720A} \approx L_{720B} < L_{720C}$); and $L_{710A}$ is approximately equal to $L_{710B}$ while each of $L_{710A}$ and $L_{710B}$ is less than $L_{710C}$ ($L_{710A} \approx L_{710B} < L_{710C}$).

The first etching process 701 can include a plasma process with at least one of the following gases: hydrogen bromide (HBr), chlorine (Cl), or argon (Ar). As a non-limiting example, the first etching process 701 may be performed with the following conditions: a bias power of about 50 watts to about 3000 watts, a pressure of about 2 millitorr to about 80 torr, a process time of about 5 seconds to about 300 seconds, a temperature of about 25° C. to about 100° C., a gas flow of HBr of about 10 standard cubic centimeters per minute to about 500 standard cubic centimeters per minute, a gas flow of Cl of about 10 standard cubic centimeters per minute to about 500 standard cubic centimeters per minute, and a gas flow of Ar of about 30 standard cubic centimeters per minute to about 300 standard cubic centimeters per minute. However, it is noted that source powers, bias powers, pressures, and flow rates outside of these ranges are also contemplated.

Figure 8:
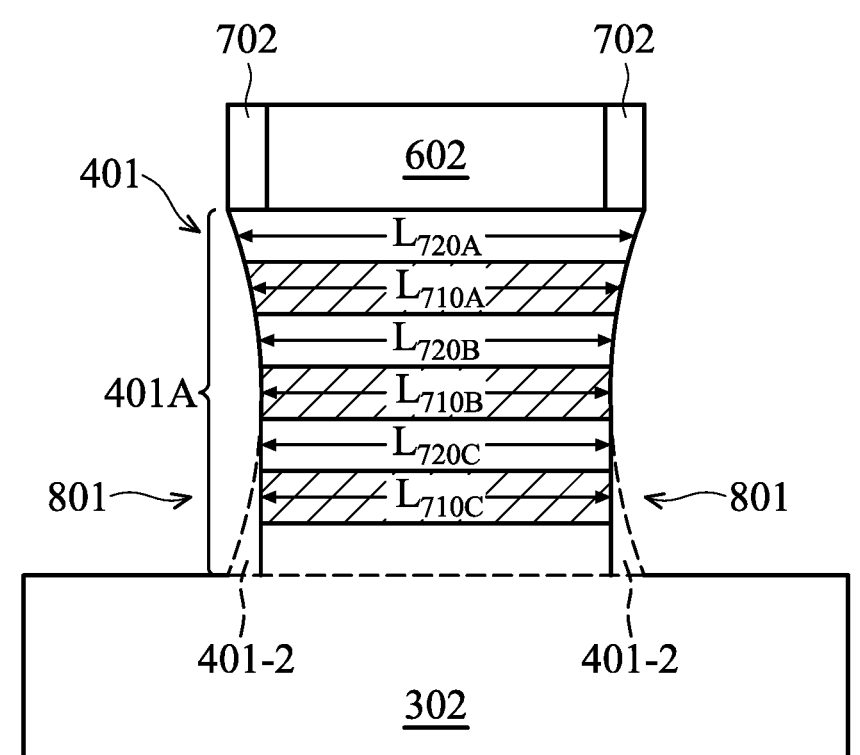
Figure 9:
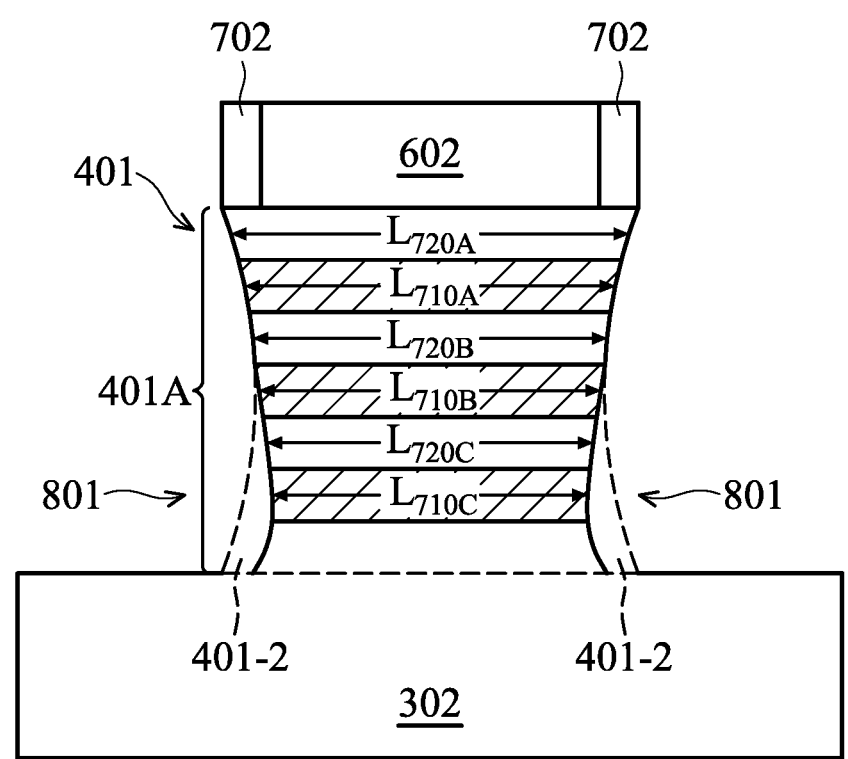

Corresponding to operation 212 of FIG. 2, FIGS. 8 and 9 are each a cross-sectional view of the GAA FET device 300 in which second portions of the stack structure 401 are removed through a second etching process 801, at one of the various stages of fabrication. Such second portions are indicated by dotted lines and referenced as 401-2 in FIG. 8. It should be noted that the second portion 401-2 was a part of the stack structure 401 shown in FIG. 7. Further, the second portion 401-2 was located laterally next to a lower part of the first portion 401-1. The cross-sectional views of FIGS. 8 and 9 are each cut in the lengthwise direction of a fin structure of the GAA FET device 300 (e.g., cross-section B-B indicated in FIG. 1).

The second etching process 801 may have an isotropic characteristic to etch the stack structure 401 in a plural number of directions. Through such an all-directional etching process, the particularly protruding portions of the stack structure 401, e.g., the bottommost semiconductor layers 710C and 720C, may be laterally pushed back or inside. Stated another way, the bottommost semiconductor layers 710C and 720C may each be trimmed shorter in its longitudinal direction. Accordingly, upon performing the second etching process 801, the stack structure 401 may have its sidewalls 401A each presented in a single-side bow-shape, as illustrated in FIG. 8, or in an asymmetrical bow-shape, as illustrated in FIG. 9. The term "single-side bow-shape," as used herein, may refer to a curve having its middle portion protruding farther than one of its side portions; and the term "asymmetrical bow-shape," as used herein, may refer to a curve having its middle portion protruding farther than one of its side portions and less than the other of its side portions.

For example, in the embodiments of FIG. 8, the topmost semiconductor layer 720A may have a longer longitudinal length than the middle semiconductor layer 720B and the bottommost semiconductor layer 720C, in which the middle semiconductor layer 720B and the bottommost semiconductor layer 720C may have approximately the same length. That is, $L_{720A}$ is greater than $L_{720C}$ and $L_{720B}$ while $L_{720C}$ is approximately the same as $L_{720B}$ ($L_{720B} \approx L_{720C} < L_{720A}$). Similarly, the topmost semiconductor layer 710A may have a longer longitudinal length than the middle semiconductor layer 710B and the bottommost semiconductor layer 710C, in which the middle semiconductor layer 710B and the bottommost semiconductor layer 710C may have approximately the same length. That is, $L_{710A}$ is greater than $L_{710C}$ and $L_{710B}$ while $L_{710C}$ is approximately the same as $L_{710B}$ ($L_{710B} \approx L_{710C} < L_{710A}$). As such, a difference between $L_{720C}$ and $L_{720A}$ or $L_{720B}$ (e.g., $L_{720C} - L_{720A}$ or $L_{720C} - L_{720B}$) is equal to or less than 0 nanometers; a difference between $L_{710C}$ and $L_{710A}$ or $L_{710B}$ (e.g., $L_{710C} - L_{710A}$ or $L_{710C} - L_{710B}$) is equal to or less than 0 nanometers.

For example, in the embodiments of FIG. 9, the topmost semiconductor layer 720A may have a longer longitudinal length than the middle semiconductor layer 720B, and the middle semiconductor layer 720B may have a longer longitudinal length than the bottommost semiconductor layer 720C. That is, $L_{720A}$ is greater than $L_{720B}$, and $L_{720B}$ is greater than $L_{720C}$ ($L_{720A} > L_{720B} > L_{720C}$). Similarly, the topmost semiconductor layer 710A may have a longer longitudinal length than the middle semiconductor layer 710B, and the middle semiconductor layer 710B may have a longer longitudinal length than the bottommost semiconductor layer 710C. That is, $L_{710A}$ is greater than $L_{710B}$, and $L_{710B}$ is greater than $L_{710C}$ ($L_{710A} > L_{710B} > L_{710C}$). As such, a difference between $L_{720C}$ and $L_{720A}$ or $L_{720B}$ (e.g., $L_{720C} - L_{720A}$ or $L_{720C} - L_{720B}$) is equal to or less than 0 nanometers; a difference between $L_{710C}$ and $L_{710A}$ or $L_{710B}$ (e.g., $L_{710C} - L_{710A}$ or $L_{710C} - L_{710B}$) is equal to or less than 0 nanometers.

The second etching process 801 can include a plasma process with at least one of the following gases: hydrogen ($H_2$), a fluorine-based gas, or nitrogen ($N_2$). The fluorine-based gas is selected from a group consisting of: difluoromethane ($CH_2F_2$), fluoromethane ($CH_3F$), trifluoromethane ($CHF_3$), tetrafluoromethane ($CF_4$), sulphur hexafluoride ($SF_6$), nitrogen trifluoride ($NF_3$), octafluorocyclobutane ($C_4F_8$), hexafluorobutadiene ($C_4F_6$), and combinations thereof. The second etching process 801 can further include the following gases: methane ($CH_4$) and argon (Ar). As a non-limiting example, the second etching process 801 may be performed with the following conditions: a bias power of about 30 watts to about 1000 watts, a pressure of about 2 millitorr to about 80 torr, a process time of about 3 seconds to about 150 seconds, a temperature of about 25° C. to about 100° C., a gas flow of $H_2$ of about 50 standard cubic centimeters per minute to about 500 standard cubic centimeters per minute, a gas flow of $CH_4$ of about 5 standard cubic centimeters per minute to about 200 standard cubic centimeters per minute, a gas flow of the fluorine-based gas of about 5 standard cubic centimeters per minute to about 200 standard cubic centimeters per minute, a gas flow of Ar of about 20 standard cubic centimeters per minute to about 300 standard cubic centimeters per minute, and a gas flow of $N_2$ of about 5 standard cubic centimeters per minute to about 200 standard cubic centimeters per minute. However, it is noted that source powers, bias powers, pressures, and flow rates outside of these ranges are also contemplated.

Although two etching process (e.g., 701 and 801) are illustrated, it should be understood that more etching processes may be performed to etch the stack structure 401. For example, a third etching process similar to the first etching process and a fourth etching process similar to the second etching process 801 may be performed, following the first etching process 701 and second etching process 801. In another example, one or more etching processes, each of which is similar to the second etching process 801, may be performed, following the first etching process 701 and second etching process 801.

Figure 10:
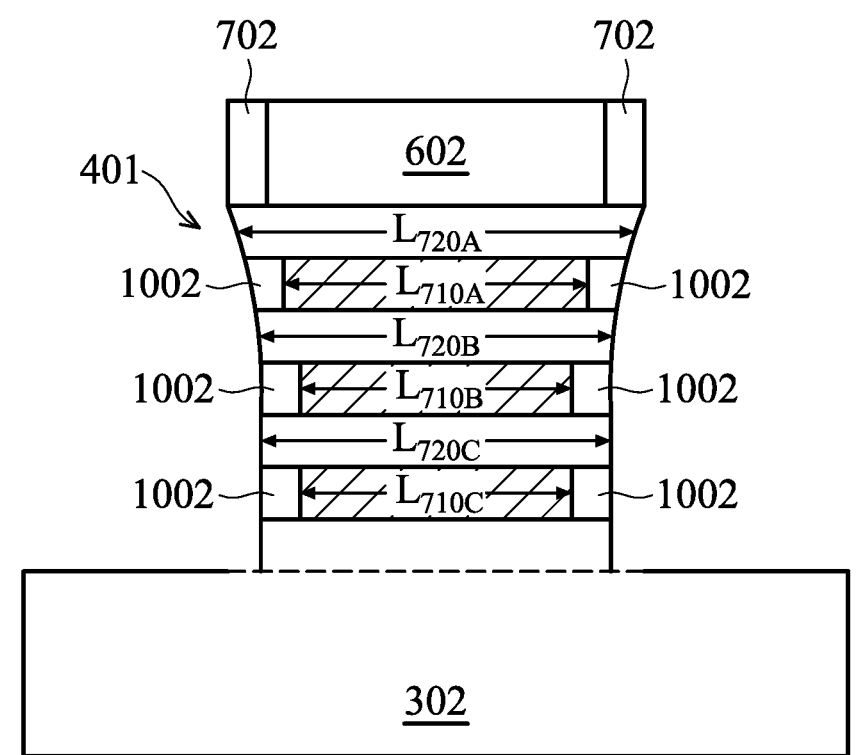
Figure 11:
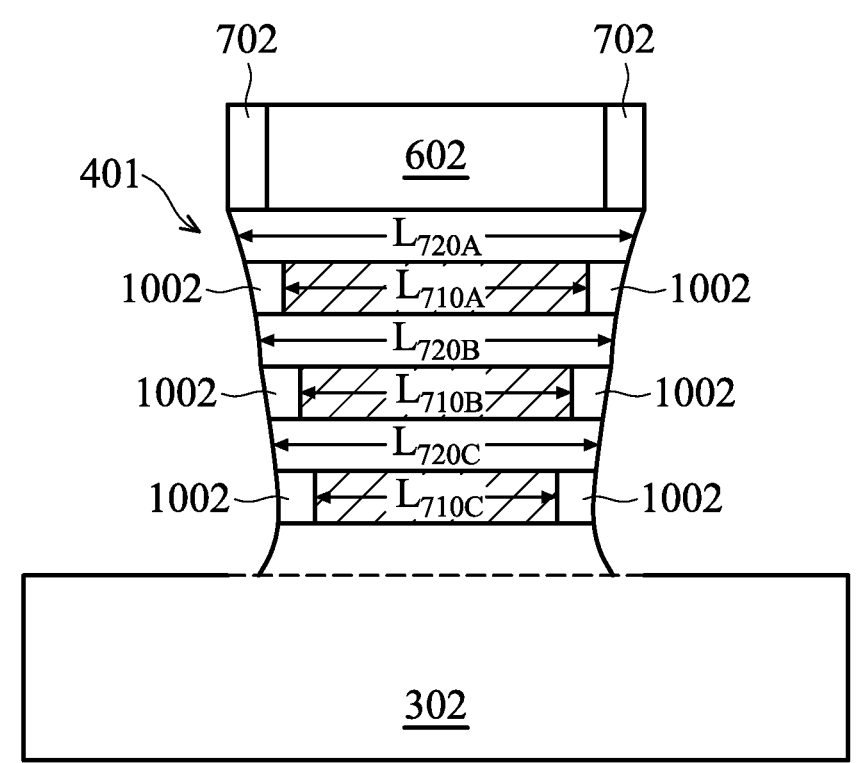

Corresponding to operation 214 of FIG. 2, FIGS. 10 and 11 are each a cross-sectional view of the GAA FET device 300 including a number of inner spacers 1002, at one of the various stages of fabrication. FIGS. 10 and 11 are the following cross-sectional views of FIGS. 8 and 9, respectively. The cross-sectional views of FIGS. 10 and 11 are each cut in the lengthwise direction of a fin structure of the GAA FET device 300 (e.g., cross-section B-B indicated in FIG. 1).

To form the inner spacers 1002, respective end portions of each of the nanostructures 710 are removed. The end portions of the nanostructures 710 can be removed (e.g., etched)

using a "pull-back" process to pull the nanostructures 710 back by a pull-back distance. Accordingly, each of $L_{710A}$, $L_{710B}$, and $L_{710C}$ may be reduced by the pull-back distance. In an example where the semiconductor layers 720 include Si, and the semiconductor layers 710 include SiGe, the pull-back process may include a hydrogen chloride (HCl) gas isotropic etch process, which etches SiGe without attacking Si. As such, the Si layers (nanostructures) 720 may remain intact during this process. Consequently, a number of pairs of recesses can be formed. These recesses are then filled with a dielectric material to form the inner spacers 1002. As shown in FIGS. 10-11, each pair of the inner spacers 1002 are formed along respective etched ends of the nanostructures 710.

In some embodiments, the inner spacer 1002 can be formed conformally by chemical vapor deposition (CVD), or by monolayer doping (MLD) of nitride followed by spacer RIE. The inner spacer 1002 can be deposited using, e.g., a conformal deposition process and subsequent isotropic or anisotropic etch back to remove excess spacer material on the sidewalls of the stack structure 401 and on a surface of the semiconductor substrate 302. The inner spacer 1002 can be formed of silicon nitride, silicon boron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 12:
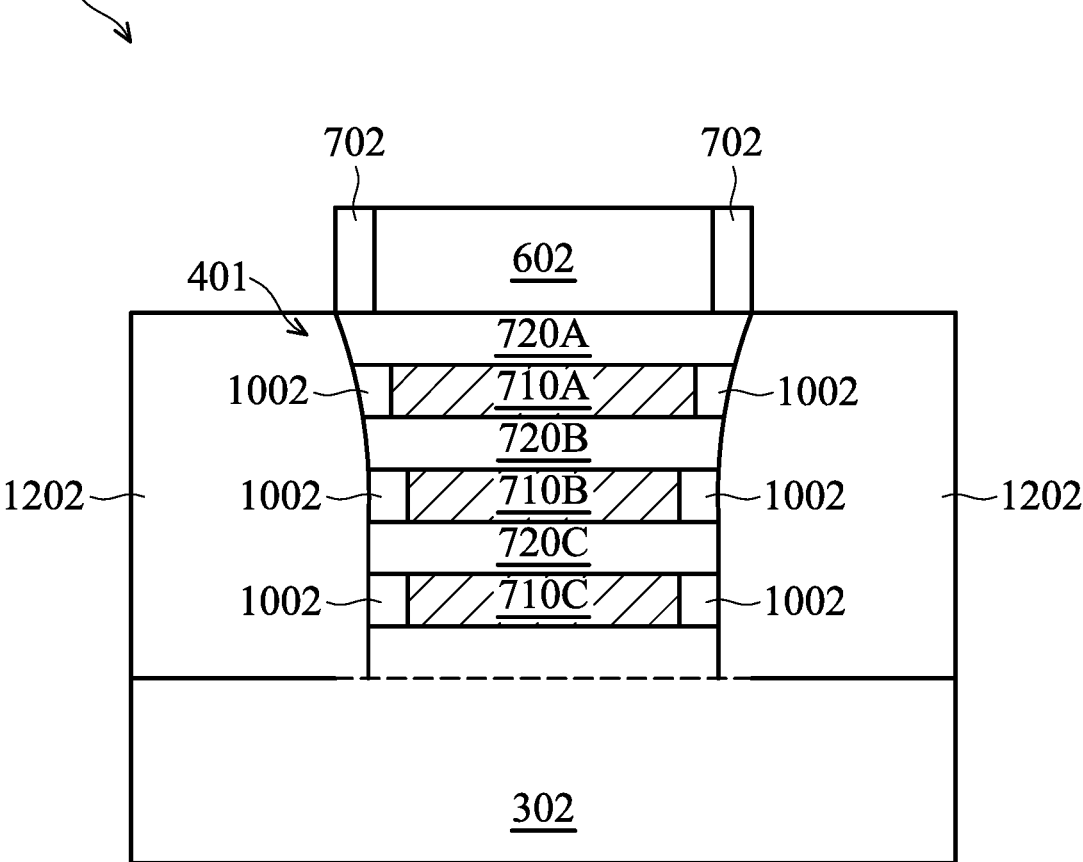
Figure 13:
Figure 13:
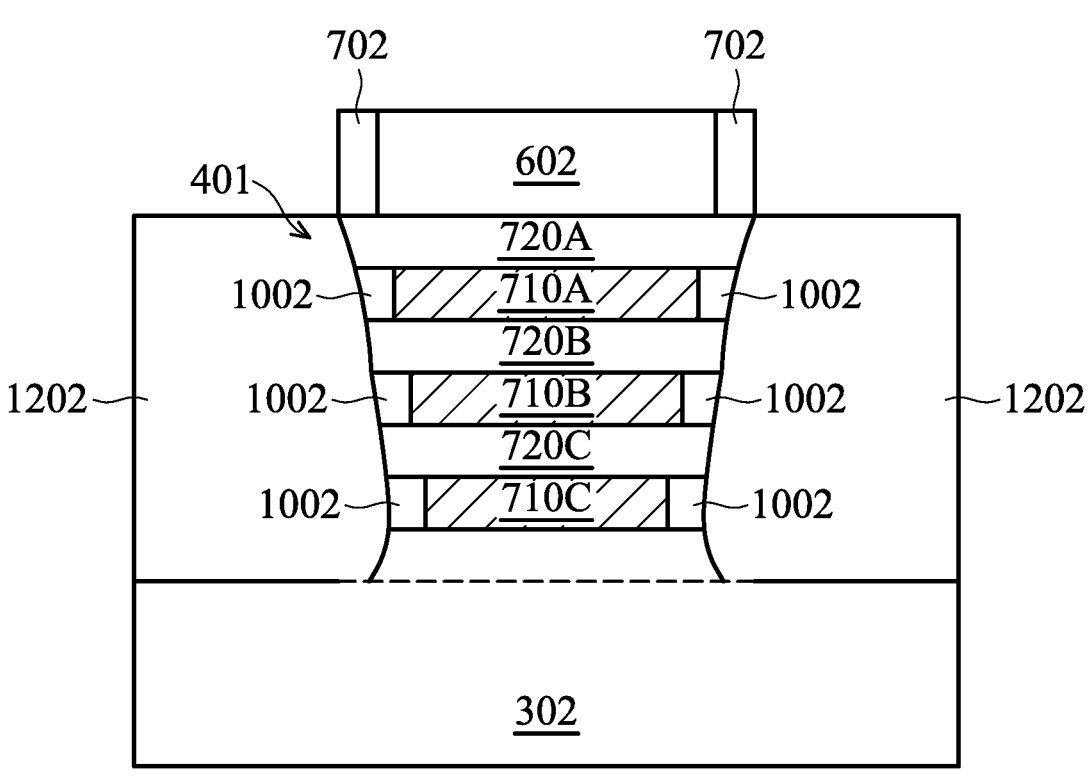
Figure 13:
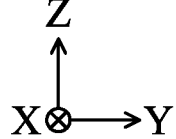

Corresponding to operation 216 of FIG. 2, FIGS. 12 and 13 are each a cross-sectional view of the GAA FET device 300 including a pair of epitaxial structures 1202, at one of the various stages of fabrication. FIGS. 12 and 13 are the following cross-sectional views of FIGS. 10 and 11, respectively. The cross-sectional views of FIGS. 12 and 13 are each cut in the lengthwise direction of a fin structure of the GAA FET device 300 (e.g., cross-section B-B indicated in FIG. 1).

The epitaxial structures 1202 may be formed to contact respective ends of each of the nanostructures 720 (along the Y direction). Further, the epitaxial structures 1202 are separated (or otherwise isolated) from respective ends (along the Y direction) of the nanostructures 710 with the inner spacers 1002. The epitaxial structures 1202 can each have a plural number of layers disposed on top of one another. In some embodiments, a doping concentration of the epitaxial structure 1202 may have a gradient from the bottom to the top. For example, a lower layer of the epitaxial structure 1202 may have a lower doping concentration while an upper layer of the epitaxial structure 1202 may have a higher doping concentration. The nanostructures 720 may collectively serve as a channel structure of the GAA FET device 300, and the epitaxial structures 1202 may serve a drain structure and a source structure of the GAA FET device 300, respectively, according to various embodiments of the present disclosure.

The epitaxial structures 1202 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), any other suitable material, or combinations thereof. The epitaxial structures 1202 may be formed using one or more epitaxial layer growth processes on exposed ends of each of the nanostructures 720. For example, the growth process can include a selective epitaxial growth (SEG) process, CVD deposition techniques (e.g., vapor-phase epitaxy (VPE) and/ or ultra-high vacuum CVD (UHV-CVD)), molecular beam epitaxy, or other suitable epitaxial processes. In-situ doping (ISD) may be applied to form doped epitaxial structures 1202, thereby creating the junctions for the GAA FET device 300. For example, when the GAA FET device 300 is configured in n-type, the epitaxial structures 1202 can be doped by implanting n-type dopants, e.g., arsenic (As), phosphorous (P), etc., into them. When the GAA FET device 300 is configured in p-type, the epitaxial structures 1202 can be doped by implanting p-type dopants, e.g., boron (B), etc., into them.

Figure 14:
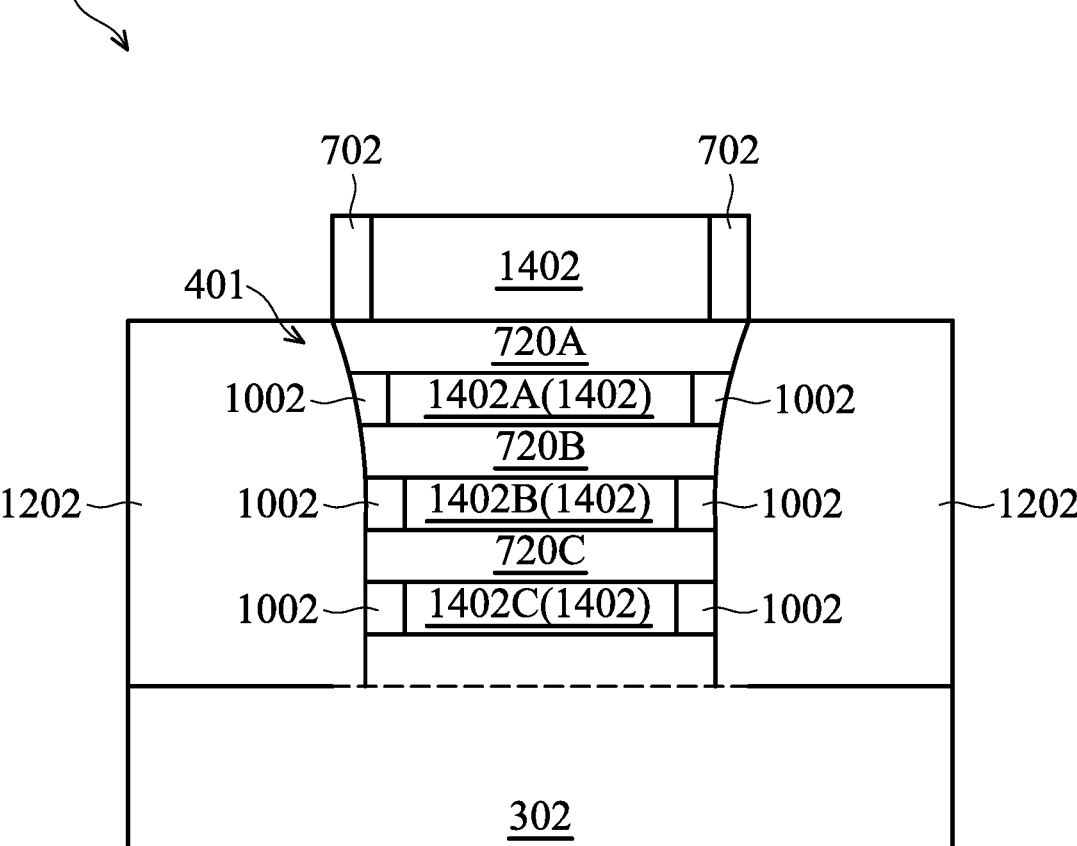
Figure 15:
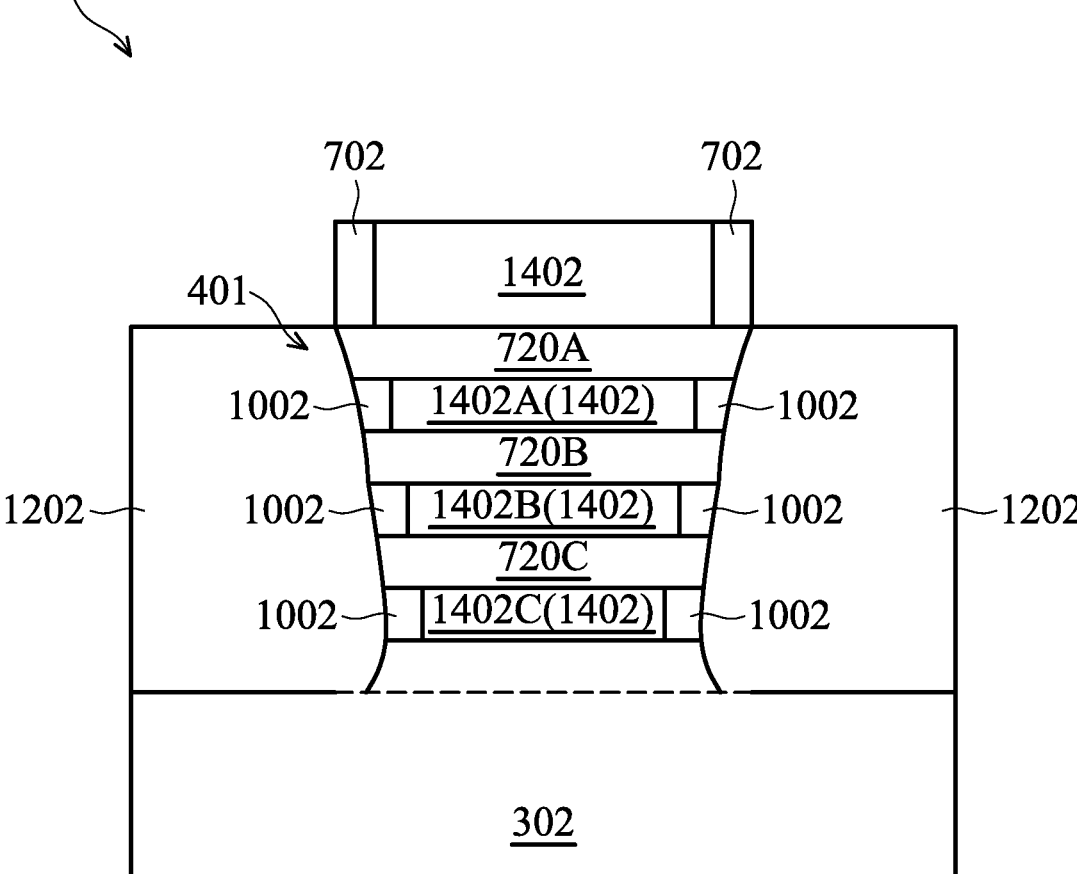
Figure 15:
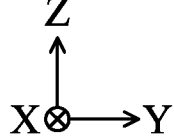

Corresponding to operation 218 of FIG. 2, FIGS. 14 and 15 are each a cross-sectional view of the GAA FET device 300 including an active (e.g., metal) gate structure 1402, at one of the various stages of fabrication. FIGS. 14 and 15 are the following cross-sectional views of FIGS. 12 and 13, respectively. The cross-sectional views of FIGS. 14 and 15 are each cut in the lengthwise direction of a fin structure of the GAA FET device 300 (e.g., cross-section B-B indicated in FIG. 1).

Following the formation of the epitaxial structures 1202, the dummy gate structure 602 and the nanostructures 710 (FIGS. 12-13) may be collectively or respectively removed to form a gate trench. In some embodiments, the dummy gate structure 602 and/or the nanostructures 710 can be removed by applying a selective etch (e.g., a hydrochloric acid (HCl)), while leaving the nanostructures 720, the gate spacers 702, and inner spacers 1002 substantially intact. In an example, after the removal of the dummy gate structure 602, a portion of the gate trench, exposing respective sidewalls of each of the nanostructures 720 that face the X direction, may be formed. After the removal of the nanostructures 710 to further extend the gate trench, respective bottom surface and/or top surface of each of the nanostructures 720 may be exposed. Consequently, a full circumference of each of the nanostructures 720 can be exposed.

Next, the active gate structure 1402 is formed to wrap around each of the nanostructures 720 (which collectively function as the channel structure of the GAA FET device 300). The active gate structure 1402 includes a gate dielectric and a gate metal, in some embodiments. The gate dielectric can wrap around each of the nanostructures 720, e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the nanostructures 720.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

As the active gate structure 1402 essentially fills the gate trench (partially formed by the removal of the nanostructures 710), the active gate structure 1402 can have a number of sections corresponding to the number of nanostructures 710. For example in FIGS. 14 and 15, the active gate structure 1402 includes sections 1402A, 1402B, and 1402C. The sections 1402A and 1402B may collectively wrap around the nanostructure 720B; and the sections 1402B and 1402C may collectively wrap around the nanostructure 720C. Further, the sections 1402A, 1402B, and 1402C may inherit the dimensions and profiles of the nanostructures 710A, 710B, and 710C (e.g., FIGS. 10-11), respectively. As such, the sections 1402B and 1402C may have a similar length ($L_{710B}$ or $L_{710C}$), which can be shorter than a length ($L_{710A}$) of the section 1402A (FIG. 14); and the section 1402C may have a length ($L_{710C}$) shorter than a length ($L_{710B}$) of the section 1402B, which can be further shorter than a length ($L_{710A}$) of the section 1402A (FIG. 15).

Figure 16:
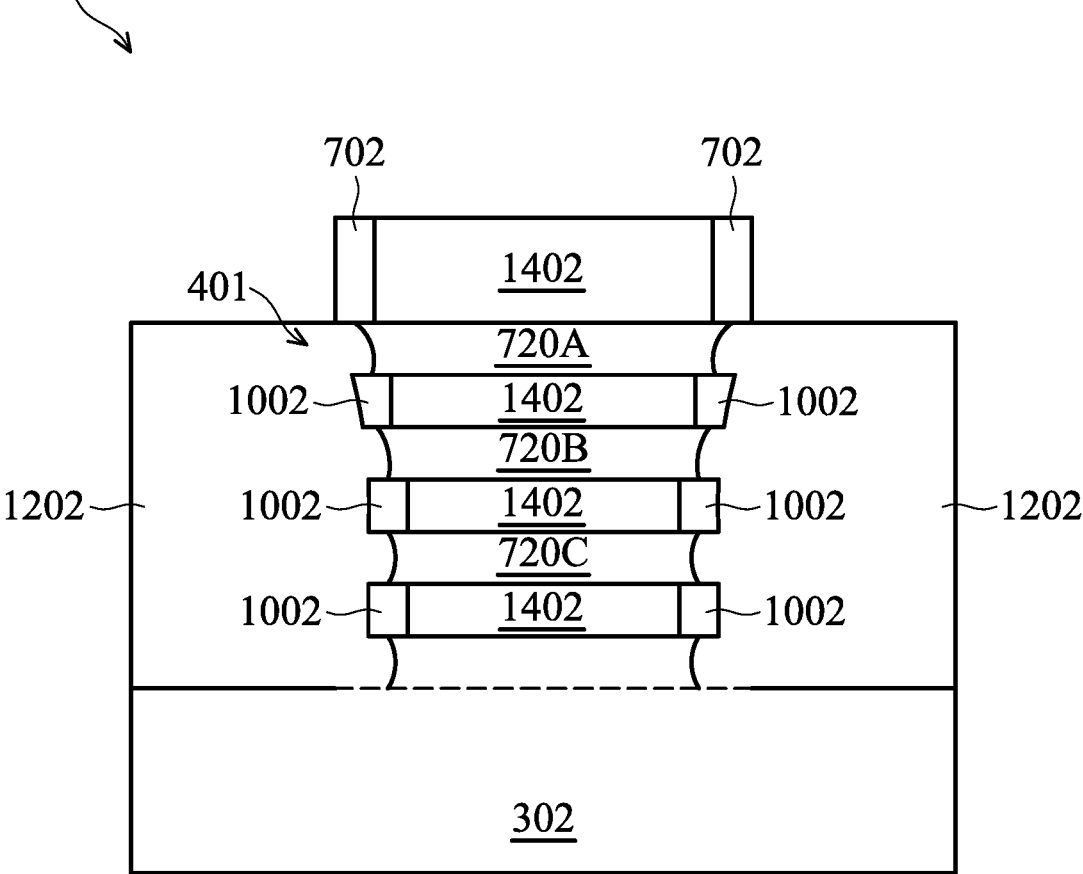
FIGS. 16, 17, 18, and 19 illustrate cross-sectional views of the GAA FET device of FIG. 14, in accordance with some other embodiments.

FIG. 16 illustrates a cross-sectional view of the GAA FET device 300, according to another embodiment of the present disclosure. As shown, the nanostructures 720A, 720B, and 720C (together with the protruding portion of the substrate 302) may each have a shorter length (in the X direction) than the corresponding (adjacent) sections of active gate structure 1402 together with corresponding inner spacers 1002. The stack structure 401 with these shorter nanostructures 720A-C may sometimes be referred to as having a kink profile. Such shorter nanostructures 720A-C may be formed during the second etching process 801 (FIGS. 8-9), in some embodiments.

Figure 17:
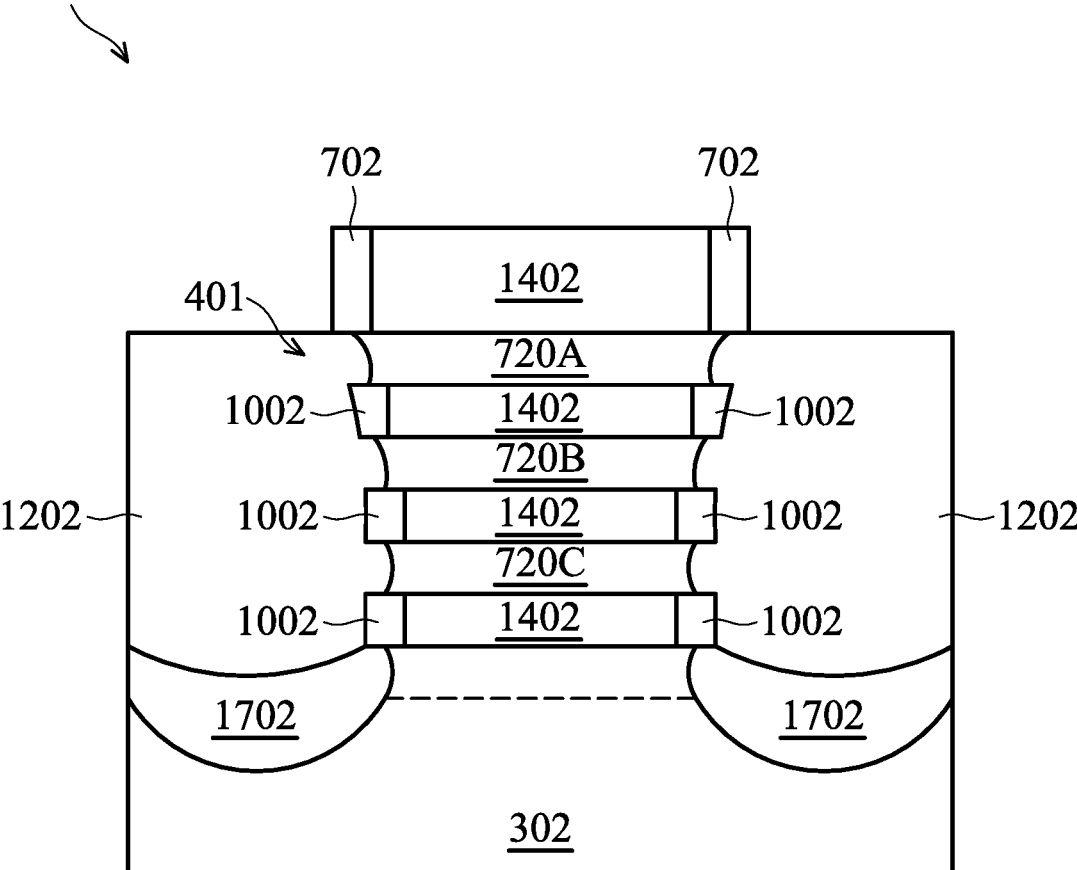
Figure 18:
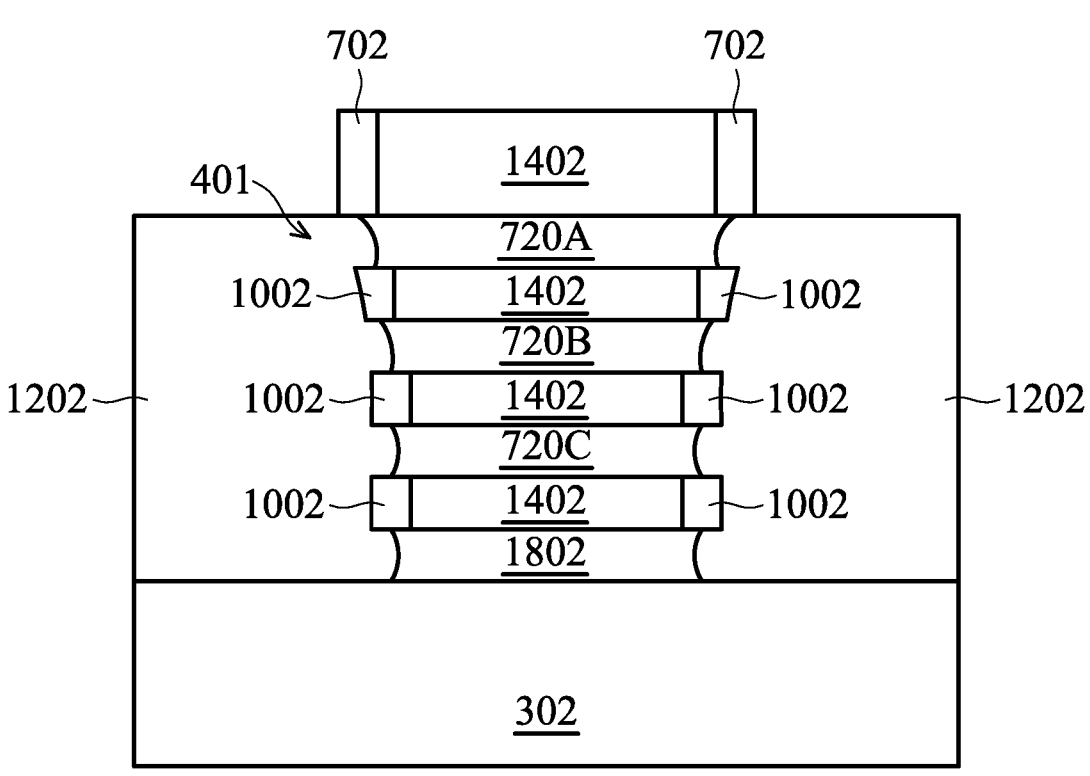
Figure 19:
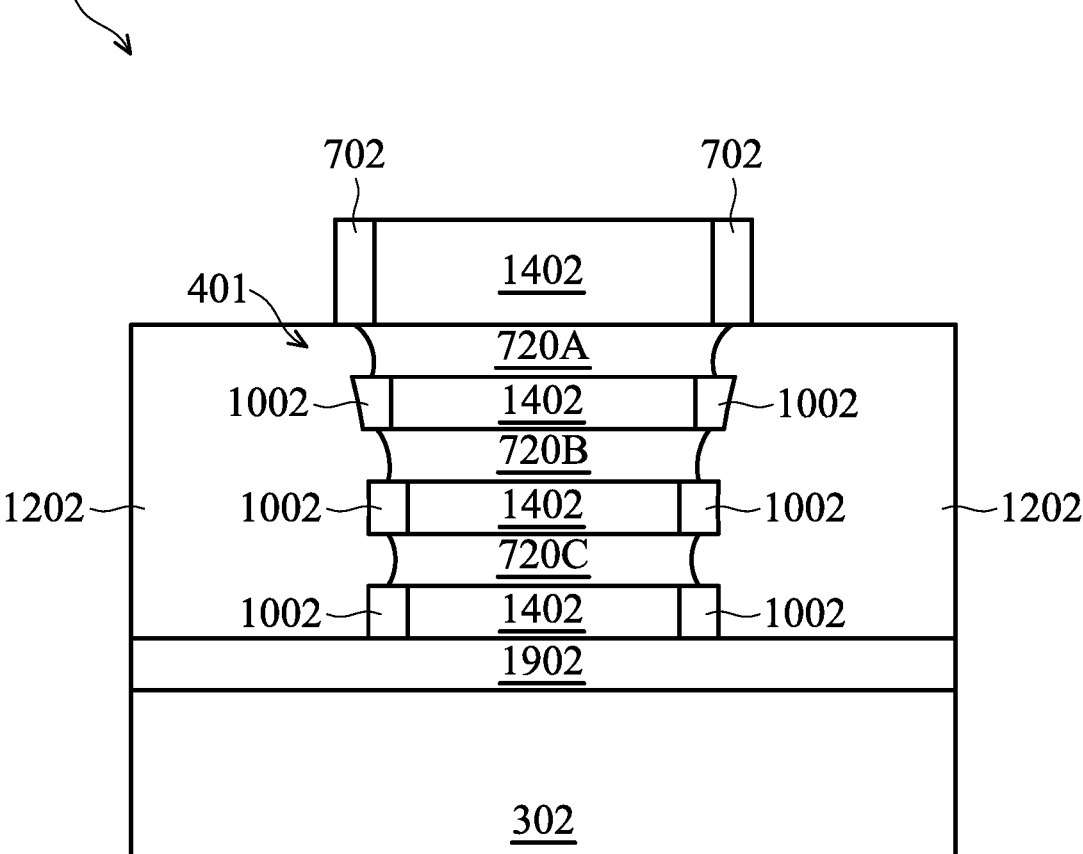

FIGS. 17, 18, and 19 each illustrate a cross-sectional view of the GAA FET device 300, according to yet another embodiment of the present disclosure. Each of the cross-sectional views in FIGS. 17-19 shows that the GAA FET device 300 has a kink profile along the sidewalls of the stack structure 401. However, it should be noted that the cross-sectional views of FIGS. 17-19 may not have such a kink profile, while remaining within the scope of the present disclosure. In FIG. 17, a dielectric layer 1702 is disposed below the epitaxial structure 1202. In FIG. 18, a dielectric layer 1802 is disposed below the bottommost section of the active gate structure 1402. In FIG. 19, a dielectric layer 1902 is disposed below the bottommost section of the active gate structure 1402 and also the epitaxial structure 1202. In some embodiments, each of the dielectric layers 1702 to 1902 may have a material selected from the group consisting of: SiN, SiO$_2$, SiON, SiCN, SiCON, SiCO, HfO, AlO, and combinations thereof.

In one aspect of the present disclosure, a method for fabricating a semiconductor device is disclosed. The method includes forming, over a substrate, a stack extending along a first lateral direction, wherein the stack includes a plurality of first semiconductor layers and a plurality of second semiconductor layers alternately arranged on top of one another; overlaying a first portion of the stack with a first gate structure, wherein the first gate structure extends along a second lateral direction perpendicular to the first lateral direction; removing a second portion of the stack through a first etching process, wherein the second portion was disposed next to the first portion along the first lateral direction; and removing a third portion of the stack through a second etching process, wherein the third portion was disposed next to a lower part of the second portion.

In another aspect of the present disclosure, a method for fabricating a semiconductor device is disclosed. The method includes alternately growing, over a substrate, a plurality of first semiconductor layers and a plurality of second semiconductor layers as a stack; overlaying the stack with a dummy gate structure; removing a portion of the stack that is not overlaid by the dummy gate structure; trimming a lower part of a remaining portion of the stack.

In yet another aspect of the present disclosure, a semiconductor device is disclosed. The semiconductor device includes a plurality of semiconductor layers vertically spaced from one another, wherein the plurality of semiconductor layers each extend along a first lateral direction; a metal gate structure extending along a second lateral direction and comprising a plurality of sections, wherein each of the plurality of semiconductor layers is wrapped by adjacent ones of the plurality of sections; a plurality of pairs of inner spacers, each of the pairs of inner spacers respectively disposed next to ends of a corresponding one of the plurality of sections; and a pair of source/drain structures in contact with ends of each of the plurality of semiconductor layers, respectively, wherein the sections are electrically isolated from the pair of source/drain structures with the pairs of inner spacers. Along the first lateral direction, a lower one of the semiconductor layers is shorter than an upper one of the semiconductor layers.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:

forming, over a substrate, a stack extending along a first lateral direction, wherein the stack includes a plurality of first semiconductor layers and a plurality of second semiconductor layers alternately arranged on top of one another, and wherein the stack comprises a first portion, a second portion, and a third portion, the second portion is disposed next to the first portion along the first lateral direction, and the third portion is disposed next to a lower part of the second portion;

overlaying a first portion of the stack with a first gate structure, wherein the first gate structure extends along a second lateral direction perpendicular to the first lateral direction;

removing the second portion of the stack through a first etching process; and removing the third portion of the stack through a second etching process, forming an asymmetrical bow-shaped sidewall in the stack.

2. The method of claim 1, wherein the first etching process includes an anisotropic etching process, and the second etching process includes an isotropic etching process.

3. The method of claim 2, wherein the first etching process has a first plasma process with a first bias power and the second etching process has a second plasma process with a second bias power, and wherein the first bias power is substantially higher than the second bias power.

4. The method of claim 2, wherein the first etching process has a first plasma process with at least one of the following gases: hydrogen bromide (HBr), chlorine (Cl), or argon (Ar), and the second etching process has a second plasma process with at least one of the following gases: hydrogen ($H_2$), a fluorine-based gas, or nitrogen ($N_2$).

5. The method of claim 4, wherein the fluorine-based gas is selected from a group consisting of: difluoromethane ($CH_2F_2$), fluoromethane ($CH_3F$), trifluoromethane ($CHF_3$), tetrafluoromethane ($CF_4$), sulphur hexafluoride ($SF_6$), nitrogen trifluoride ($NF_3$), octafluorocyclobutane ($C_4F_8$), hexafluorobutadiene ($C_4F_6$), and combinations thereof.

6. The method of claim 1, following the step of removing the third portion of the stack through the second etching process, further comprising:

replacing end portions of each of the first semiconductor layers with a pair of inner spacers; and epitaxially growing a source/drain structure from a remaining portion of the stack, wherein the source/drain structure is in contact with an end of each of the second semiconductor layers.

7. The method of claim 6, further comprising:

replacing the first semiconductor layers and the first gate structure with a second gate structure;

wherein the second gate structure includes at least a high-k dielectric layer and a metal gate.

8. The method of claim 6, wherein a bottommost one of the second semiconductor layers has a first length along the first lateral direction and a next bottommost one of the second semiconductor layers has a second length along the first lateral direction, and wherein the first length is equal to the second length.

9. The method of claim 6, wherein a bottommost one of the second semiconductor layers has a first length along the first lateral direction and a next bottommost one of the second semiconductor layers has a second length along the first lateral direction, and wherein the first length is less than the second length.

10. The method of claim 6, wherein the pair of inner spacers each extend farther than at least an adjacent one of the second semiconductor layers along the first lateral direction.

11. A method for fabricating a semiconductor device, comprising:

alternately growing, over a substrate, a plurality of first semiconductor layers and a plurality of second semiconductor layers as a stack;

overlaying the stack with a dummy gate structure;

removing a portion of the stack that is not overlaid by the dummy gate structure; and trimming a lower part of a remaining portion of the stack, wherein an upper part of the remaining portion of the stack has a curved sidewall and the lower part of the remaining portion of the stack has a sidewall extending in a direction different than a lengthwise direction of the dummy gate structure.

12. The method of claim 11, wherein the step of removing the portion of the stack includes an anisotropic etching process, and the step of trimming the lower part of the remaining portion of the stack includes an isotropic etching process.

13. The method of claim 12, wherein the anisotropic etching process includes a first plasma process with a first bias power and the isotropic etching process includes a second plasma process with a second bias power, and wherein the first bias power is substantially higher than the second bias power.

14. The method of claim 12, wherein the anisotropic etching process has a first plasma process with at least one of the following gases: hydrogen bromide (HBr), chlorine (Cl), or argon (Ar), and the isotropic etching process has a second plasma process with at least one of the following gases: hydrogen ($H_2$), a fluorine-based gas, or nitrogen ($N_2$).

15. The method of claim 14, wherein the fluorine-based gas is selected from a group consisting of: difluoromethane ($CH_2F_2$), fluoromethane ($CH_3F$), trifluoromethane ($CHF_3$), tetrafluoromethane ($CF_4$), sulphur hexafluoride ($SF_6$), nitrogen trifluoride ($NF_3$), octafluorocyclobutane ($C_4F_8$), hexafluorobutadiene ($C_4F_6$), and combinations thereof.

16. The method of claim 11, wherein, after the step of trimming the lower part of the remaining portion of the stack, a bottommost one of the second semiconductor layers has a first length along its longitudinal direction and a next bottommost one of the second semiconductor layers has a second length along its longitudinal direction, and wherein the first length is equal to the second length.

17. The method of claim 11, wherein, after the step of trimming the lower part of the remaining portion of the stack, a bottommost one of the second semiconductor layers has a first length along its longitudinal direction and a next bottommost one of the second semiconductor layers has a second length along its longitudinal direction, and wherein the first length is less than the second length.

18. The method of claim 17, after the step of trimming the lower part of the remaining portion of the stack, further comprising:

epitaxially growing a source/drain structure from an end of each of the second semiconductor layers;

wherein a lower part of the source/drain structure has a first doping concentration, and an upper part of the source/drain structure has a second doping concentration higher than the first doping concentration.

19. A semiconductor device, comprising:

a plurality of semiconductor layers vertically spaced from one another, wherein the plurality of semiconductor layers each extend along a first lateral direction and wherein a semiconductor layer of the plurality of semiconductor layers has a sidewall extending in a direction different than the first lateral direction;

a plurality of dielectric layers, each dielectric layer of the plurality of dielectric layers disposed vertically adjacent to a semiconductor layer of the plurality of semiconductor layers, wherein a sidewall of a dielectric layer of the plurality of dielectric layers is curved;

a metal gate structure extending along a second lateral direction and comprising a plurality of sections, wherein each of the plurality of semiconductor layers is wrapped by adjacent ones of the plurality of sections;

a plurality of pairs of inner spacers, each of the pairs of inner spacers respectively disposed next to ends of a corresponding one of the plurality of sections; and a pair of source/drain structures in contact with ends of each of the plurality of semiconductor layers, respectively, wherein the sections are electrically isolated from the pair of source/drain structures with the pairs of inner spacers;

wherein, along the first lateral direction, a lower one of the semiconductor layers is shorter than an upper one of the semiconductor layers.

20. The semiconductor device of claim 19, wherein the pair of source/drain structures each have a plurality of doping concentrations, with a higher one of the doping concentrations being formed above a lower one of the doping concentrations.

\* \* \* \* \*